United States Patent [19]
Wang

[11] Patent Number: 6,136,728
[45] Date of Patent: Oct. 24, 2000

[54] WATER VAPOR ANNEALING PROCESS

[75] Inventor: Xiewen Wang, Orange, Conn.

[73] Assignee: Yale University, New Haven, Conn.

[21] Appl. No.: 08/583,640

[22] Filed: Jan. 5, 1996

[51] Int. Cl.$^7$ .................................................. H01L 21/31
[52] U.S. Cl. .......................................... 438/773; 438/795
[58] Field of Search .................................. 437/241, 242, 437/247, 959; 148/DIG. 3, DIG. 22, DIG. 114; 438/773, 795, 909, 162, 96, 97, 510

[56] References Cited

U.S. PATENT DOCUMENTS

| | | | |
|---|---|---|---|
| 4,566,173 | 1/1986 | Gossler et al. ................. | 148/DIG. 118 |
| 4,725,560 | 2/1988 | Abernathey et al. ............. | 148/DIG. 3 |
| 5,376,590 | 12/1994 | Machida et al. ......................... | 437/235 |
| 5,500,558 | 3/1996 | Hayashide ............................... | 257/758 |

FOREIGN PATENT DOCUMENTS

| | | | |
|---|---|---|---|
| 55-22862 | 2/1980 | Japan . | |
| 60-153158 | 8/1985 | Japan .................................... | 437/247 |
| 63-169047 | 7/1988 | Japan . | |
| 4-42568 | 2/1992 | Japan . | |
| 6-61323 | 3/1994 | Japan .................................... | 437/949 |
| 8-55858 | 2/1996 | Japan . | |

OTHER PUBLICATIONS

R.C. Dockerty et al., IEEE Trans. Electron Dev. 22(2)(1975)33 "Low–Leakage . . . SiO2–Si3N4 Gate Insulator", Feb. 1975.
S. Wolf, "Silicon Processing for the VLSI Era" vol. II, pp. 20–25,195,328,334–335,428–431,434,435, Jun. 1990.
S. Itoh et al., Appl. Phys. Lett. 61(11)(1992)1313, "Rapid thermal oxidation of thin nitride dielectrics . . . ", Sep. 1992.
R.C. Dockerty et al., Proc. 11th Annual Relaibility Phys. Conf. (1973) 159 "Improved Vt stability of SNOS FETs by oxygen annealing", Apr. 1973.
Copy of PCT Written Opinion dated Nov. 5, 1997.
Samo, et al., "High Quality SiO$_2$/Si Interfaces of Poly–Crystalline Silicon Thin Film Transistors by Annealing in Wet Atmosphere," (16)157–160 (1995), IEEE Electron Dev. Lett.

*Primary Examiner*—Charles Bowers
*Assistant Examiner*—Craig Thompson
*Attorney, Agent, or Firm*—Fish & Richardson P.C.

[57] ABSTRACT

A method of fabricating semiconductor devices including the steps of forming a silicon-based dielectric layer containing nitrogen having a concentration that is in a range of a fraction of a percent up to stoichiometric Si$_3$N$_4$; and annealing the dielectric layer in a water vapor atmosphere.

10 Claims, 6 Drawing Sheets

WATER VAPOR ANNEALING PROCESS

BACKGROUND OF THE INVENTION

The invention relates generally to a process for improving the electrical characteristics of semiconductor devices which employ silicon nitride and/or silicon oxynitride layers.

A typical fabrication sequence of the silicon nitride (or oxynitride) gate dielectric involves: (1) cleaning of Si wafer; (2) forming silicon nitride (or oxynitride) on Si wafer; (3) performing a post-deposition high-temperature anneal in nitrogen or oxygen and typically at temperatures >800° C.; (4) depositing a gate electrode; and (5) performing a post-gate electrode anneal in nitrogen or forming gas, typically between 400° C. and 500° C. A variety of dielectric deposition methods have been used in the past, including APCVD, LPCVD, PECVD, and JVD.

In addition to deposition, the silicon oxynitride mentioned above may be formed by nitridizing a thermal oxide layer at an elevated temperature in $N_2O$ or $NH_3$ ambient, or by directly oxidizing Si in an $N_2O$ ambient, or by reoxidizing a silicon nitride or oxynitride film, etc.

Relative to silicon dioxide, silicon nitride or silicon oxynitride possesses a number of attractive features as a gate dielectric for Field Effect Transistors (FET's), including (1) higher dielectric constant, (2) better barrier against impurity diffusion, and (3) better resistance to radiation damage and hot-carrier damage. Unfortunately, the electrical properties of the silicon/nitride interface are very poor due to the presence of very high densities of interface traps and bulk traps. Therefore, numerous attempts have been made by various research groups over the past 3 decades to improve the electrical properties of the silicon nitride layer and thereby produce FET's which out-perform conventional MOSFET's using silicon dioxide as the gate dielectric. However, none of these efforts has been truly successful.

SUMMARY OF THE INVENTION

In one aspect, the invention involves inserting a new process step in the fabrication of Metal-Insulator-Semiconductor Devices (MIS's) that contain silicon nitride or silicon oxynitride in their gate dielectrics, where the silicon oxynitride may contain as little as a fraction of a percent of nitrogen. For brevity, such devices will be called MNS devices in this document. This new process dramatically improves the performance of a variety of MNS devices.

The new process step is: (1) a water-vapor annealing treatment after the formation of the gate dielectric (i.e., after step 3 above); or (2) a water-vapor annealing treatment which replaces the conventional post-gate electrode annealing treatment (i.e., step 5 above); or (3) a water-vapor annealing treatment after subsequent metalization steps, or (4) a combination of the above. The water-vapor anneal may be performed at a temperature in the range of about 270–500° C. for 30 min. (approx.). The results of performing such a water-vapor anneal are remarkable. It greatly reduces the density of interface traps and it greatly enhances channel mobility in MNS devices, to the point that MNS devices should be commercially viable.

In general, in one aspect, the invention is a method of fabricating semiconductor devices including the steps of forming a silicon-based dielectric layer containing nitrogen having a concentration that is in a range of a fraction of a percent up to stoichiometric $Si_3N_4$; and annealing the dielectric layer in a water vapor atmosphere.

Preferred embodiments have the following features. The method further includes the step of forming a gate-electrode on the dielectric layer. The water vapor anneal step is performed after forming the gate-electrode. alternatively, the water vapor anneal step is performed before forming the gate-electrode. The dielectric layer is made of silicon nitride, or silicon oxynitride, or a nitrided silicon oxide, or a nitrodized silicon oxide. The water vapor anneal step is performed at a temperature which is in the range of about 270° C. to 500° C.

In general, in another aspect, the invention is a semiconductor device fabricated in accordance with the above-described procedure (i.e., using a WVA step).

In general, in yet another aspect, the invention is a method of fabricating semiconductor devices including the steps of forming a dielectric layer made of a material that is selected from a group of materials consisting of silicon nitride, silicon oxynitride, nitrided oxide, and nitrodized oxide; annealing the dielectric layer in a water vapor atmosphere.

In general, in still another aspect, the invention is a method of improving electrical characteristics of a metal-insulator-semiconductor (MIS) device in which the insulating layer comprises a dielectric selected from the group of materials consisting of silicon nitride, silicon oxynitride, nitrided oxide, and nitrodized oxide. The method includes the step of annealing the device in a water vapor atmosphere.

The use of water vapor at a modest annealing temperature in the nitride fabrication process "passivates" the nitride/Si (or oxynitride/Si) interface. The advantage over the present technology is that it enables high-quality MOSFET's to be fabricated. The invention can be used in the fabrication of all semiconductor devices and IC's containing a silicon nitride or nitrided silicon oxide layer where the electrical properties of that layer and its interfaces are of concern. For example, it can be used to improve the performance and characteristics of: (1) gate dielectrics of FET's used in microprocessors, DRAMs, SRAMs, Flash Memories, and EEPROMs, just to name a few; (2) dielectrics for storage capacitors in DRAMs; (3) inter-poly dielectrics; and (4) thin-film transistors (used in SRAMs and flat panel display technologies, for example.)

Other advantages and features will become apparent from the following description of the preferred embodiment and from the claims.

DESCRIPTION OF THE PREFERRED EMBODIMENTS

I have discovered that performing a water-vapor anneal on silicon nitride or silicon oxynitride layers substantially improves the quality of the devices. Experiments have been conducted which dramatically showed the benefits of adding such an anneal to the fabrication procedure.

For some of the experiments that are reported herein, we started with (100) oriented Si wafers which had a resistivity of about a few ohm-cm. We processed these substrates to fabricate metal-nitride-silicon capacitors using standard fabrication procedures. First, we performed a standard cleaning procedure to produce very clean bare silicon wafers with no native oxide on its surfaces (step 100). These wafers were then loaded into a silicon nitride deposition chamber. We deposited a silicon nitride film on the silicon substrate (step 102). The layers that were deposited were about 80–90 Å which is electrically equivalent to a $SiO_2$ layer of about 40–45 Å. After deposition, we transferred the wafer from the nitride deposition chamber to a furnace for post-deposition annealing at 800° C. for 30 minutes in a dry $N_2$ ambient (step 104).

We followed the post-deposition anneal with an aluminum evaporation and then used standard photolithography procedures to form the gate electrodes (i.e., the top electrodes) of the MNS capacitors (step 106). Then, we performed another aluminum evaporation on the backside of the wafers, thereby forming the other electrode of the MNS capacitors. Finally, we performed a post-electrode anneal in $N_2$ or forming gas (step 108).

Typically, the process might further include a phase during which metalizations and interconnects are formed for the devices (step 110) and then the chip is passivated by applying a passivation layer (e.g. SiN) (step 112).

Note that the procedure just described also generally describes the formation of devices which utilize an oxynitride layer for the dielectric, except that instead of using deposition equipment to form a SiN layer other fabrication equipment is used to form the dielectric layer. This is illustrated by the alternative path through box labeled 114.

Figure 1:
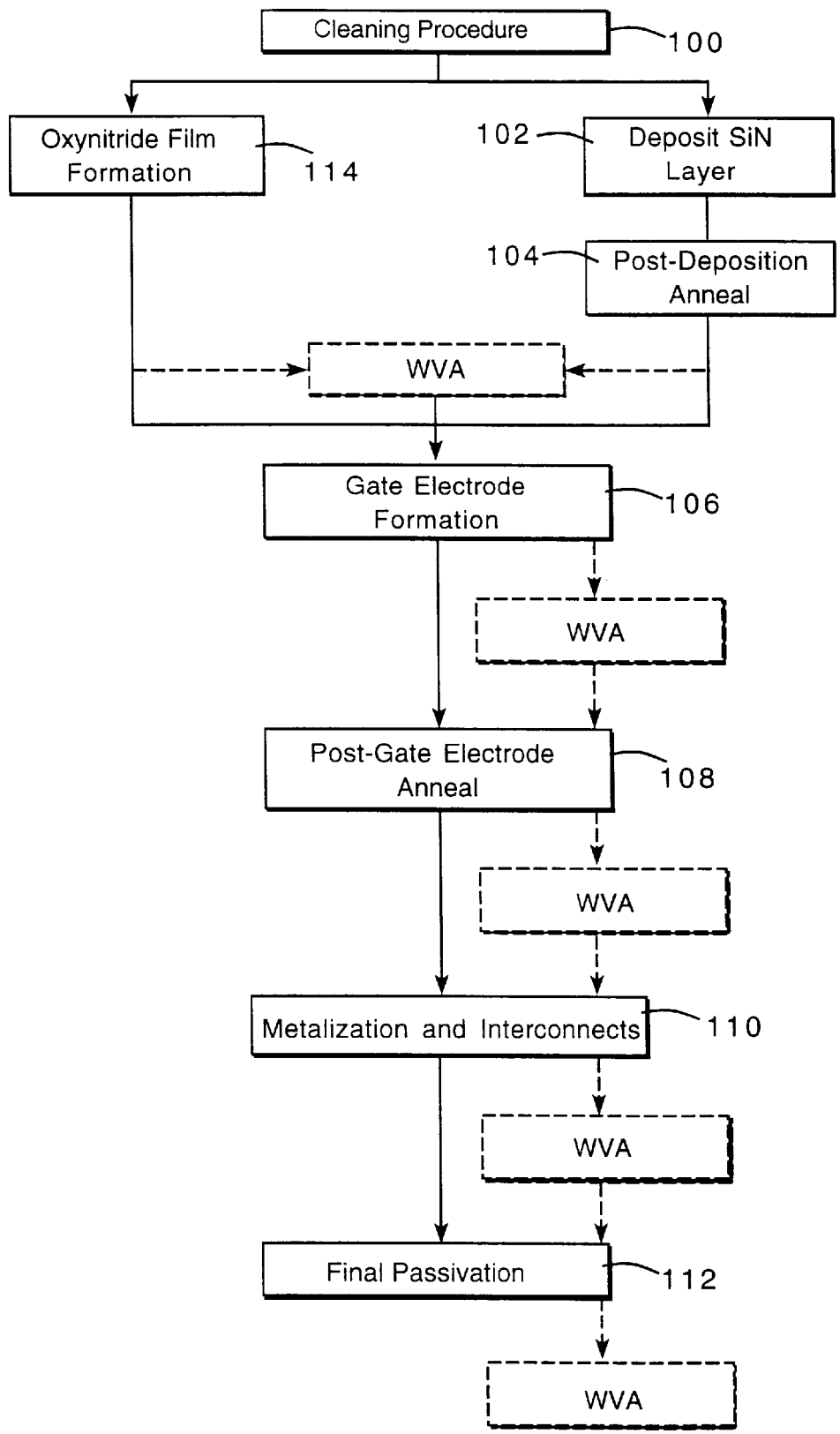
FIG. 1 shows a representative fabrication sequence that been modified in accordance with the invention.

In this general process, we inserted a water vapor anneal (WVA) step. We found that the WVA step can be inserted either before or after the electrode formation steps. The alternative locations for the WVA step are represented in FIG. 1 by the dashed boxes. Regardless of where the WVA step was inserted, it dramatically improved device performance.

We performed the WVA step in a standard steam oxidation furnace such as is typically found in many wafer fabrication facilities. The furnace tube which was at 380° C. and the total WVA anneal time was about 30 minutes. During the WVA anneal, we supplied water vapor to one end of the tube simply by using an infra-red lamp to heat up a tank of deionized (DI) water that was connected to the tube. The heated DI water evaporated and flowed through the tube and over the devices that were being annealed.

We fabricated two sets of MNS capacitors, one set made by using a post-deposition WVA and the other set made without any WVA. In both sets, the dielectric (i.e., the silicon nitride layer) had an equivalent oxide thickness of about 5.3 nm (nanometers). We compared the electrical characteristics of devices from both sets. For example, we measured quasi-static capacitance versus gate voltage for devices from each set (see the curves shown in FIG. 2). Curve A represents the performance of a device which was made without using a post-deposition WVA and Curve B represents the performance of a device that was made with a post-deposition WVA. As can be seen, there is a marked reduction in quasi-static capacitance for the device that benefitted from the WVA.

Figure 2:
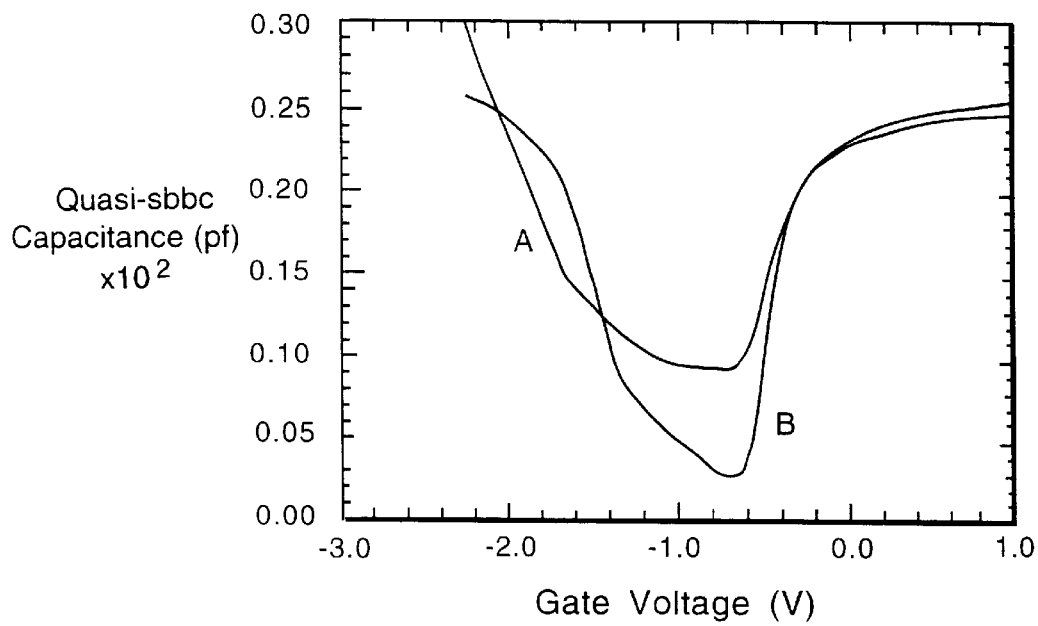
FIG. 2 is a plot of the quasi-static capacitance versus gate voltage for two MNS capacitors, one fabricated using the water-vapor anneal step (B) and the other fabricated without benefit of a water-vapor anneal step (A)
Figure 3:
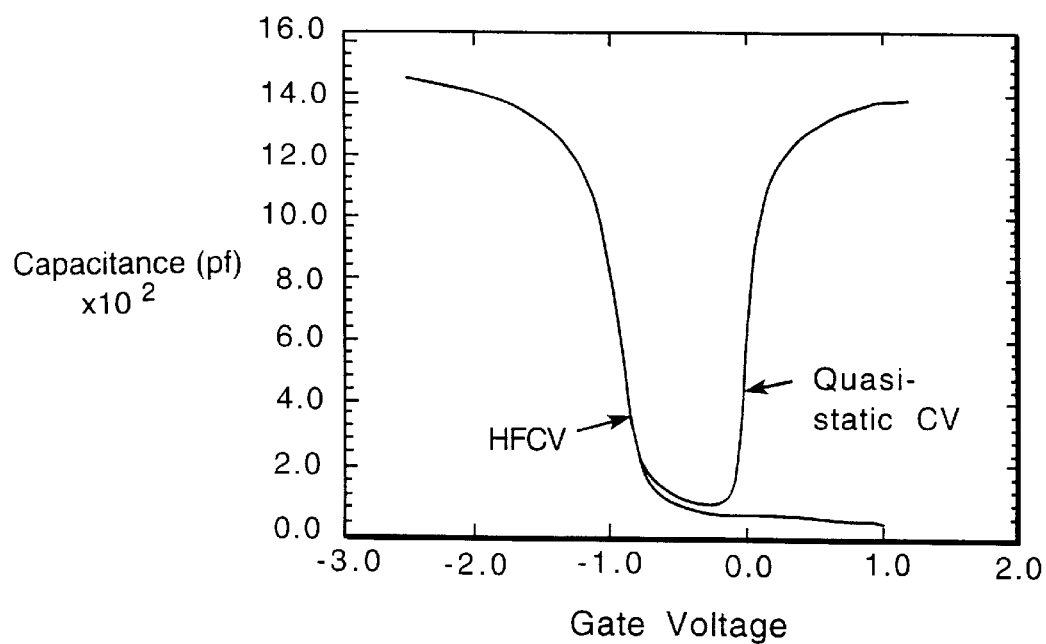
FIG. 3 shows a plot of capacitance versus gate voltage for the capacitor of curve B in FIG. 2 after it has had a further water-vapor anneal step performed as a post-gate electrode-anneal.

Referring to FIG. 3, the capacitor represented by curve B in FIG. 2 then received a WVA treatment again as a post-metal anneal and the high frequency and quasi-static capacitance versus voltage (C-V) curves were measured for this device. As can be seen, the high frequency C-V (HFCV) and the quasi-static CV curves perfectly match over much of the accumulation and depletion regions. This indicates a very low density of interface states. In addition, the measured flatband voltage of HFCV also indicated a low density of dielectric charge.

Figure 4:
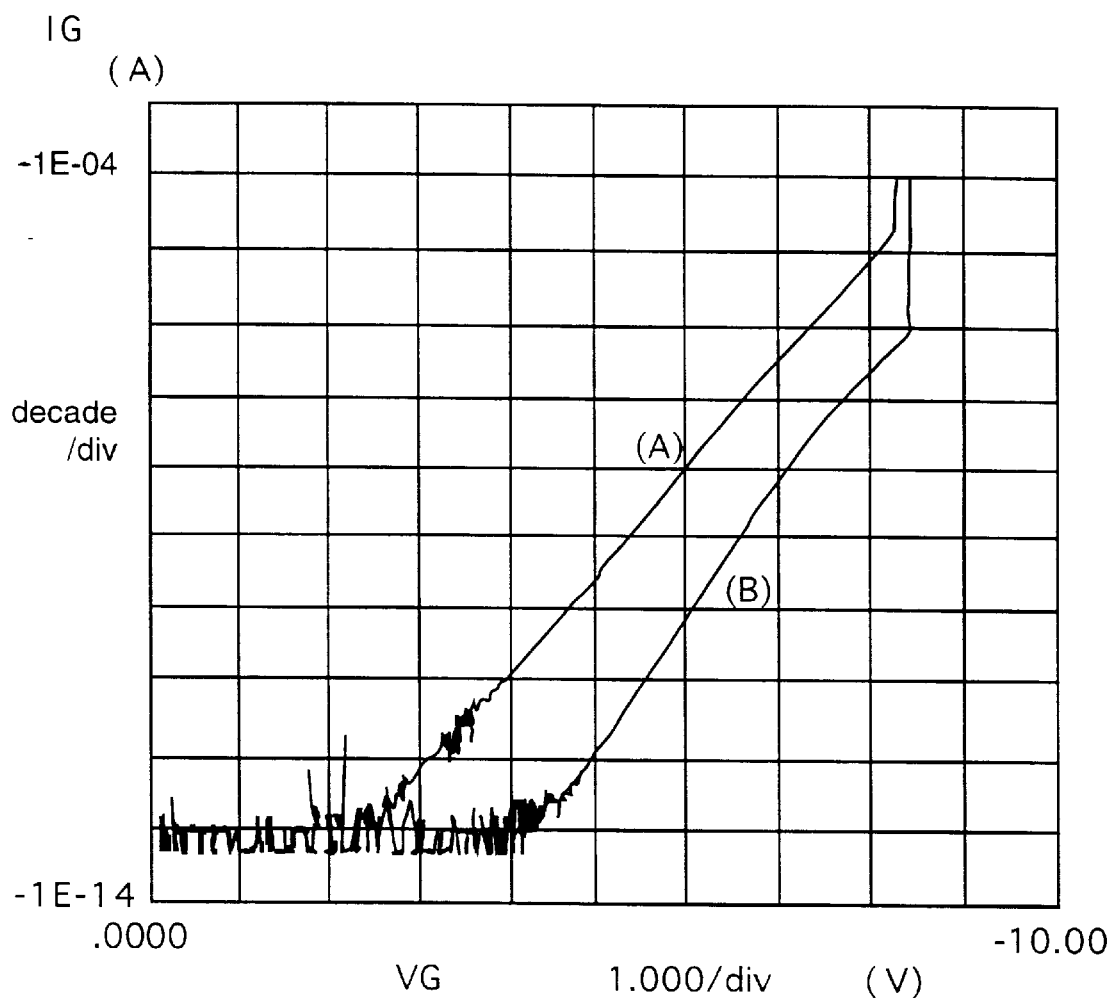
FIG. 4 is a plot of leakage current for two devices, one fabricated using the water-vapor anneal and the other fabricated without it.

We also measured the impact of a WVA on leakage current in devices that had 2 mil diameter electrodes and an effective oxide thickness of about 47 Å. These results are shown in the $I_G$ versus $V_G$ curves of FIG. 4. The curve on the left is $I_G$–$V_G$ before WVA and the curve on the right is after WVA. Again, a post-deposition WVA treatment significantly reduces leakage current.

Figure 5:
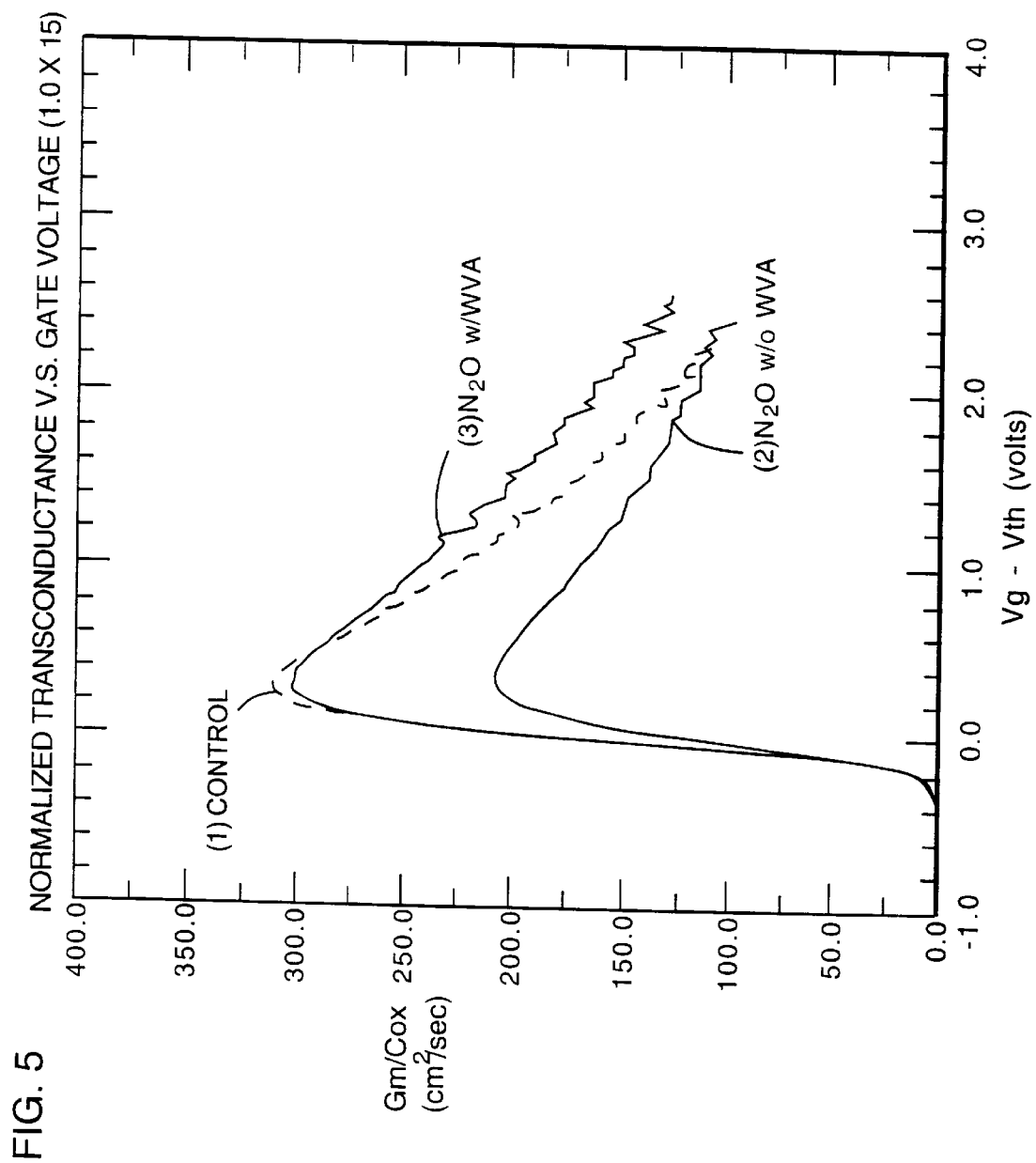
FIG. 5 is a plot of the transconductance (Gm) of: (1) a control MOSFET (dashed curve); (2) a MOSFET with $N_2O$ oxynitride without WVA treatment (lower solid); and (3) MOSFET with $N_2O$ oxynitride with WVA treatment (upper solid)

We also evaluated the impact of the WVA on the electrical performance of MOSFET's that were fabricated and supplied by a third party. These MOSFET's had an $N_2O$ oxynitride layer as the gate dielectric. The oxynitride films were formed by either annealing a previously formed $SiO_2$ layer in an $N_2O$ ambient or by oxidizing Si directly in an $N_2O$ ambient. Their thicknesses were approximately 80 Å, and they contain small amounts of nitrogen, ranging from a fraction of a percent to a few percent. FIG. 5 shows the how much transconductance (Gm) improves when the WVA is used. The lower solid curve shows the performance of the MOSFET without using a WVA and the upper solid curve shows the performance of the MOSFET after using a WVA. The dashed line represents data from a control sample, which used a thermal oxide as a gate dielectric rather than a $N_2O$ oxynitride. As can be seen, the $G_m$ values of the WVA treated device are far superior to those of the untreated device. In fact, the peak $G_m$ value of WVA treated device is as good as that of the control sample and in the high field range, the $G_m$ values are much superior even to that of the control sample.

Figure 6:
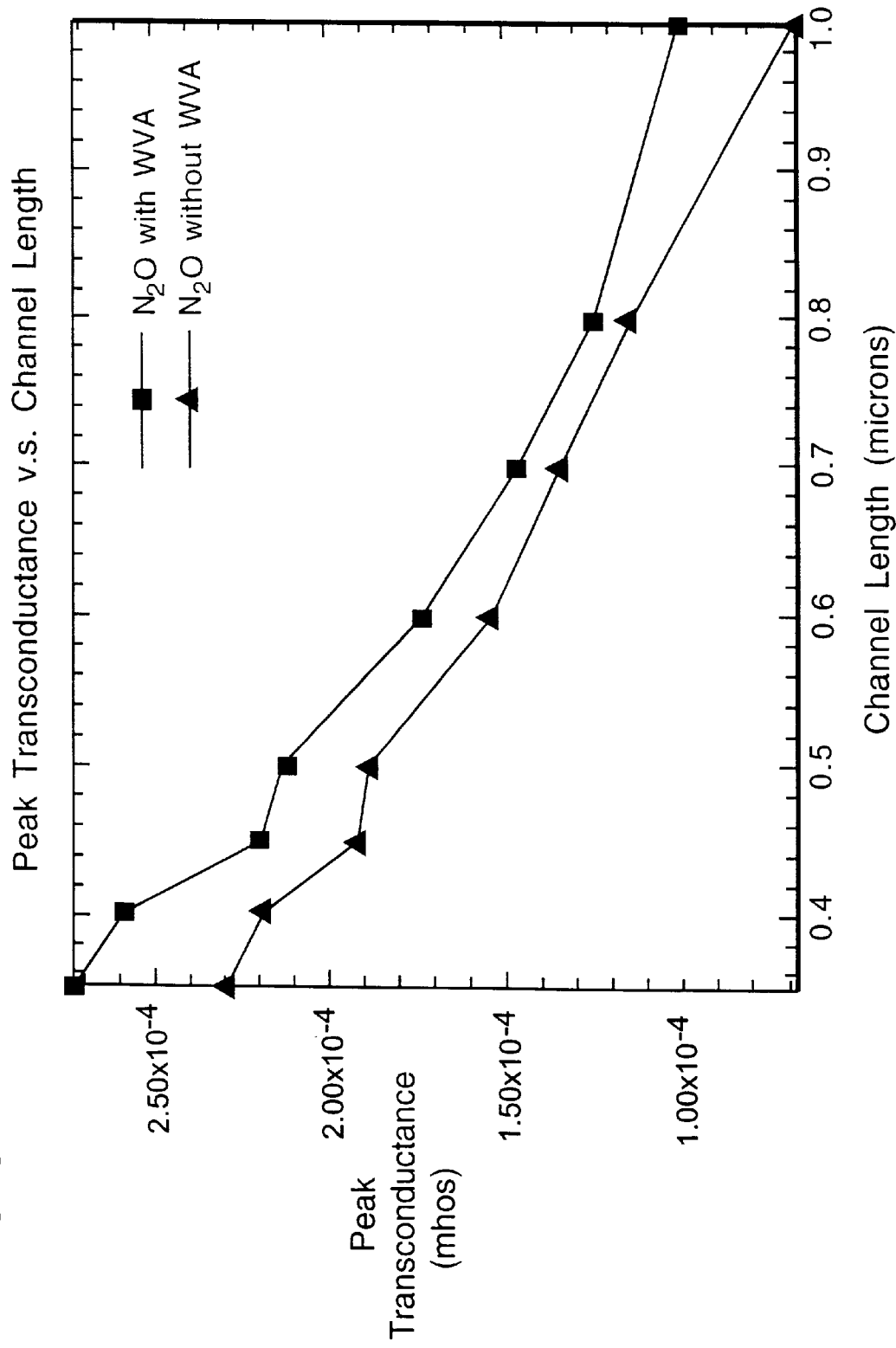
FIG. 6 is a plot of the peak transconductance versus channel length for two sets of MOSFET's with an $N_2O$ annealed gate oxide, one of which benefitted from the WVA and the other of which did not.

Referring to FIG. 6, a plot of the peak transconductance versus channel length also shows a similar consistent and substantial improvement from the WVA. The upper curve is for devices that benefitted from the WVA and the lower curve is for devices that did not use the WVA. In general, the WVA produces about a 10–20% increase in peak transconductance.

Figure 7:
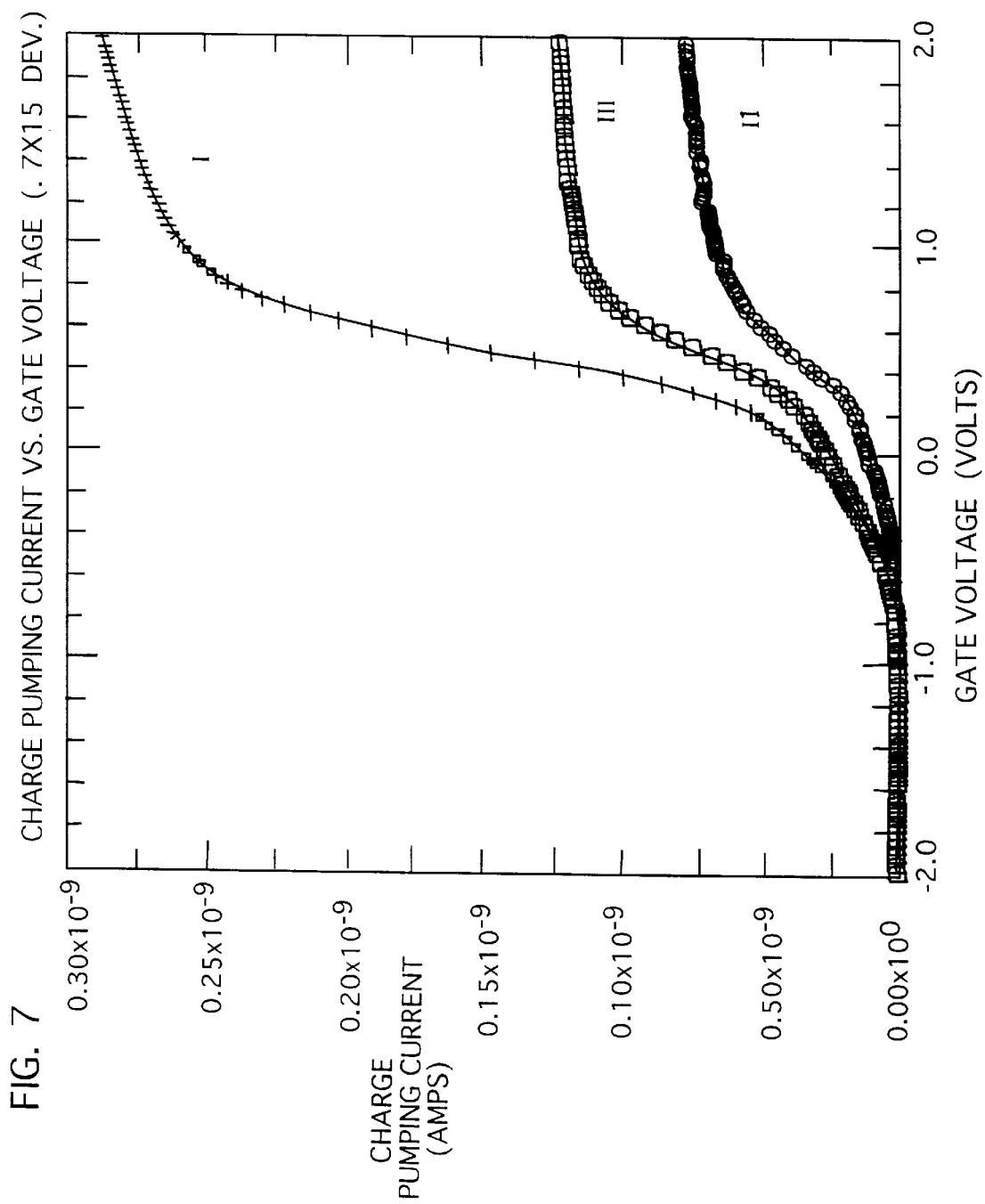
FIG. 7 are plots of charge pumping current versus gate voltage for: (I) a MOSFET having an $N_2O$ oxynitride as gate dielectric with no WVA treatment; (II) same device with WVA; (III) control device with oxide as gate dielectric.

We measured charge pumping current of the various devices and found that the WVA produced a drastic decrease in charge pumping current. This is strong evidence that the improvement that we have seen in the other measurements is due to a reduction in interface trap density and oxide charge. FIG. 7 shows three curves of charge pumping current versus gate voltage. The top curve is for a $N_2O$ oxynitride MOSFET device which was not given a WVA treatment; the bottom curve is for the same device after it was given a WVA treatment; and for comparison purposes, the middle curve is for a MOSFET that used a thermal oxide (i.e., $SiO_2$) as the gate-dielectric.

We observed a positive effect over a temperature range of 270–500° C., with the best results occurring at about 380° C. We expect, however, that as further experiments are performed, we will see the beneficial effect of the WVA under other process conditions and at temperatures outside of this range.

The nitride or oxynitride may be formed by any number of ways, including chemical vapor deposition, physical vapor deposition, or by nitriding thermal $SiO_2$ (e.g. by introducing a fraction of a percent to a few percent of nitrogen into $SiO_2$ by annealing $SiO_2$ in $N_2O$ or $NH_3$ ambient at high temperatures). It is not intended that the invention be limited in any way with regard to how the SiN or silicon oxynitride layer is formed.

The WVA step has been inserted at various locations into the fabrication process, all producing positive results. The following illustrates the variety of ways in which the WVA step was inserted into the fabrication procedure:

(1) nitride (or oxynitride) formation+WVA+high-temperature (e.g. ~800° C.) $N_2$ anneal+gate electrode deposition+post-gate electrode annealing @400° C.
(2) nitride (or oxynitride) formation+high-temperature $N_2$ anneal+WVA+gate electrode deposition+post-gate electrode annealing
(3) nitride (or oxynitride) formation+high-temperature $N_2$ anneal+gate electrode deposition+WVA (to replace post-gate electrode annealing)
(4) nitride (or oxynitride) formation+high-temperature $N_2$ anneal+WVA+gate electrode deposition+WVA (to replace post-gate electrode annealing)

Though all of the above-described combinations produced positive results, the last one tended to produce the best results.

Though we have described specific process steps and structures for which our experiments were performed, the invention is not limited to such process steps or to such structures. For example, though we used metalizations to form the gate electrodes in our experiments, today such electrodes are more typically formed by polysilicon layers. The invention is not limited to any particular manner of forming the gate electrodes. In addition, it is apparent that the water vapor anneal can be used in any structure that includes a nitride layer, an oxynitride layer, a nitrodized oxide layer, or a nitrided oxide layer, the electrical properties of which are important to device performance. Also, it appears that the water vapor anneal step can be inserted at any location(s) in the process after the formation of the dielectric layer and positive results will be achieved. This is meant to be illustrated by the different alternative locations at which the WVA steps have been inserted in the general flow diagram of the fabrication process (see FIG. 1).

This technique can be applied to any device that incorporates a dielectric layer that is composed of silicon and nitrogen atoms, including amorphous and crystal SiN and silicon oxynitride. There are many ways known in the art for forming such layers. For example, one might first grow a silicon oxide layer and then nitrodize the layer so as to introduce nitrogen into it (usually in amounts equal to only a few percent). Various techniques are known for nitriding the layer including using $N_2O$, NO or $NH_3$ ambients. Alternatively, one might form a SiN layer (e.g. by a CVD process) and then reoxidize that layer by exposing it to an oxygen or oxygen containing ambient. Clearly the composition of these layers varies widely depending of course on the particular method of fabricating the layer. In general, among other things, the nitrogen serves a similar function including, for example, forming a barrier for the out diffusion of dopant from the underlying material. The invention can be applied to all of these structures with similar results.

Other embodiments are within the following claims.

What is claimed is:

1. A method of fabricating semiconductor devices comprising the steps of:
    forming a silicon-based dielectric layer containing nitrogen having a concentration that is in a range of a fraction of a percent up to stoichiometric $Si_3N_4$; and
    annealing the dielectric layer in a water vapor atmosphere and at a temperature which is in the range of about 270° C. to 500° C.

2. The method of claim 1 further comprising forming a gate-electrode on the dielectric layer.

3. The method of claim 2 wherein the water vapor anneal step is performed after forming said gate-electrode.

4. The method of claim 2 wherein the water vapor anneal step is performed before forming said gate-electrode.

5. The method of claim 1 wherein the dielectric layer comprises silicon nitride.

6. The method of claim 1 wherein the dielectric layer comprises a silicon oxynitride.

7. The method of claim 1 wherein the dielectric layer comprises a nitrided silicon oxide or a nitrodized silicon oxide.

8. A semiconductor device fabricated in accordance with the process of claim 1.

9. A method of fabricating semiconductor device comprising the steps of:
    forming a dielectric layer made of a material that is selected from a group of materials consisting of silicon nitride, silicon oxynitride, nitrided oxide, and nitrodized oxide;
    annealing the dielectric layer in a water vapor atmosphere and at a temperature which is in the range of about 270° C. to 500° C.

10. A method of improving electrical characteristics of a metal-insulator-semiconductor (MIS) device in which the insulating layer comprises a dielectric selected from the group of materials consisting of silicon nitride, silicon oxynitride, nitrided oxide, and nitrodized oxide, said method comprising annealing the device in a water vapor atmosphere and at a temperature which is in the range of about 270° C. to 500° C.

* * * * *